(12) United States Patent
Lee

(10) Patent No.: US 8,498,175 B2
(45) Date of Patent: Jul. 30, 2013

(54) BURST ORDER CONTROL CIRCUIT

(75) Inventor: Dong-Uk Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 249 days.

(21) Appl. No.: 13/117,023

(22) Filed: May 26, 2011

(65) Prior Publication Data

US 2012/0188827 A1 Jul. 26, 2012

(30) Foreign Application Priority Data

Jan. 26, 2011 (KR) ........................ 10-2011-0007770

(51) Int. Cl.
*G11C 8/00* (2006.01)
(52) U.S. Cl.
USPC ............... 365/233.18; 365/189.05; 365/194; 365/233.11; 327/261; 327/263
(58) Field of Classification Search
USPC ............ 365/189.05, 189.08, 189.17, 189.18, 365/190, 194, 233, 11, 233.17, 233.18; 327/261, 327/263, 212–214
See application file for complete search history.

(56) References Cited

U.S. PATENT DOCUMENTS

| 2007/0070713 A1* | 3/2007 | Lee ........................ 365/189.05 |
| 2010/0085819 A1* | 4/2010 | Lee et al. ................ 365/189.11 |
| 2010/0146161 A1* | 6/2010 | Lee .............................. 710/35 |

FOREIGN PATENT DOCUMENTS

KR 100654125 12/2006

OTHER PUBLICATIONS

Notice of Allowance issued by the Korean Intellectual Property Office on Oct. 26, 2012.

* cited by examiner

*Primary Examiner* — Alexander Sofocleous
*Assistant Examiner* — Hien Nguyen
(74) *Attorney, Agent, or Firm* — IP & T Group LLP

(57) ABSTRACT

A burst order control circuit includes a signal transmitting unit transmitting a second address as first and second signals in response to a mode signal and a first address, a signal delay unit delaying a read command, the first signal, and the second signal to generate a delayed read command, a first delayed signal, and a second delayed signal, a signal generating unit configured to generate a burst signal in response to the first address and generate first and second transmission signals in response to the delayed read command and the first and second delayed signals, and an output unit sorting and outputting a plurality of data in response to the burst signal, the first transmission signal, and the second transmission signal.

20 Claims, 13 Drawing Sheets

| (SA<1>, SA<0>) | SEQUENTIAL MODE (INT='0') | INTERLEAVE MODE (INT='1') |
|---|---|---|
| (0,0) | D0,D1,D2,D3 | D0,D1,D2,D3 |
| (0,1) | D1,D2,D3,D0 | D1,D0,D3,D2 |
| (1,0) | D2,D3,D0,D1 | D2,D3,D0,D1 |
| (1,1) | D3,D0,D1,D2 | D3,D2,D1,D0 |

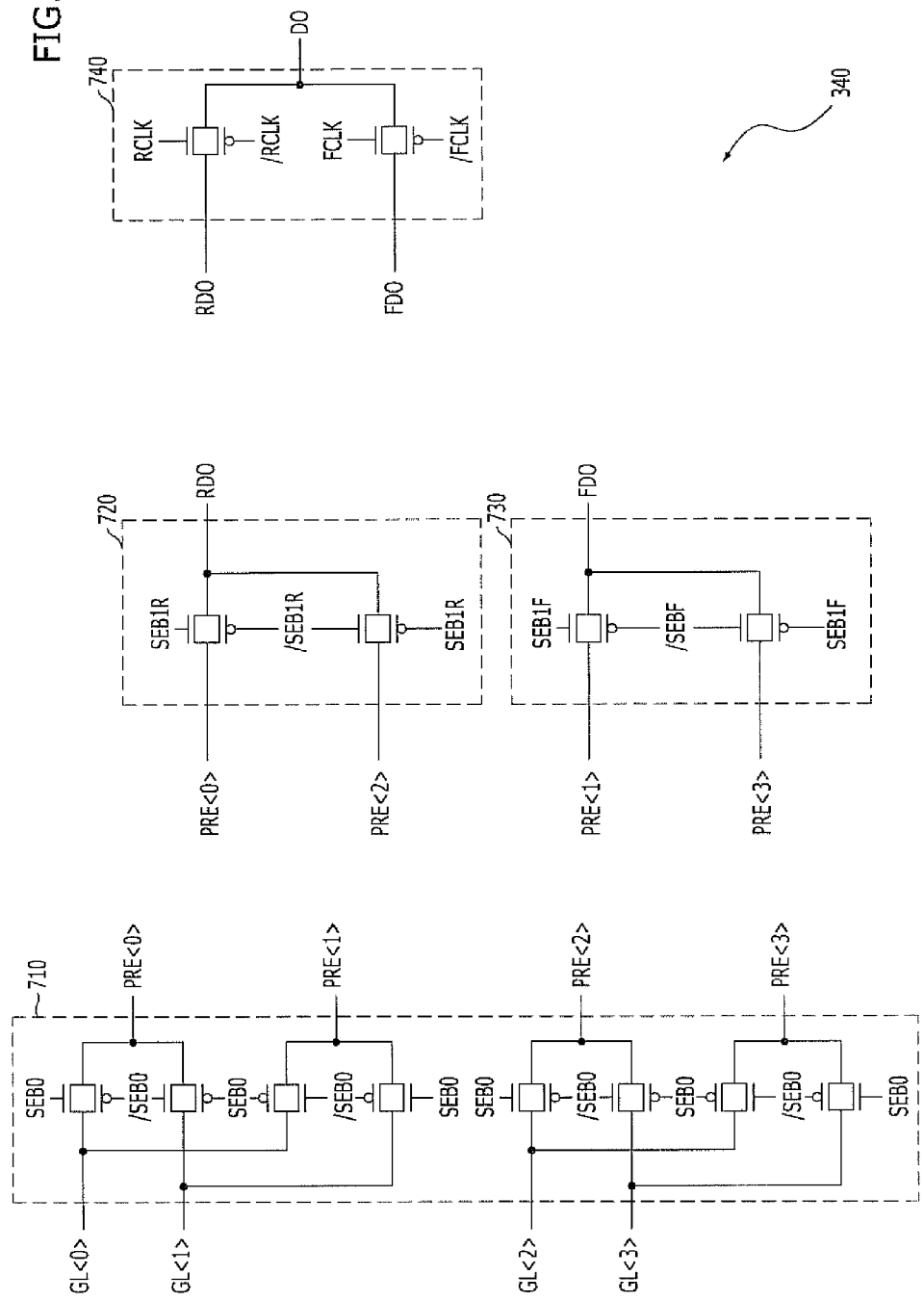

FIG. 12
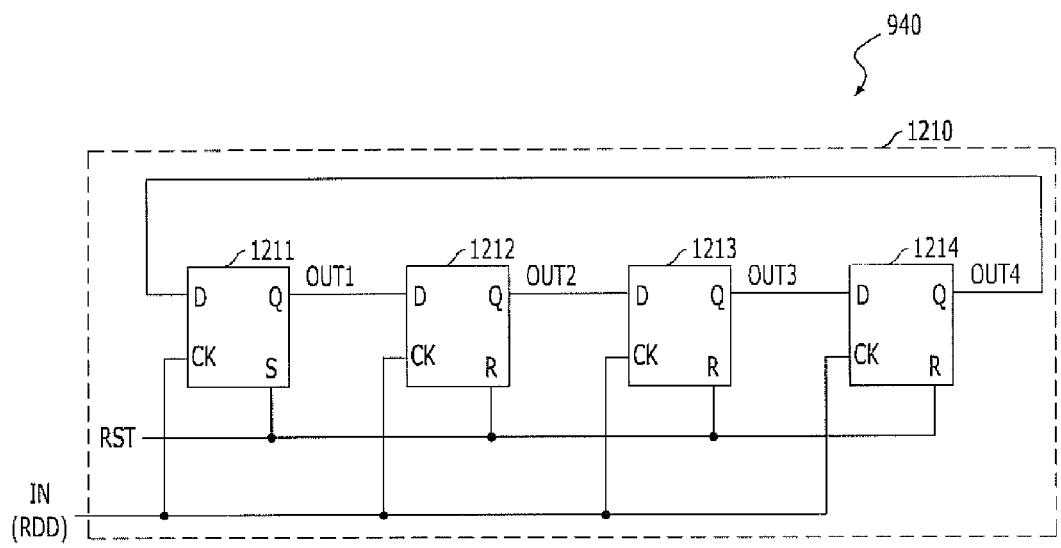
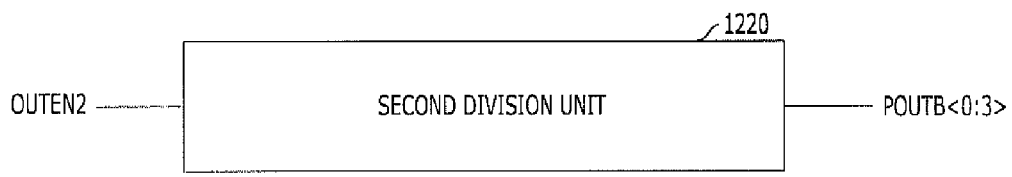
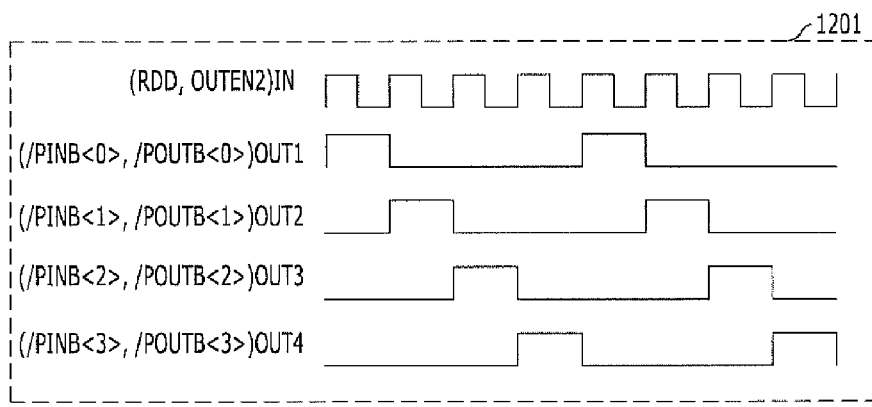

BURST ORDER CONTROL CIRCUIT

CROSS-REFERENCE TO RELATED APPLICATIONS

The present application claims priority of Korean Patent Application No. 10-2011-0007770, filed on Jan. 26, 2011, which is incorporated herein by reference in its entirety.

BACKGROUND

1. Field

Exemplary embodiments of the present invention relate to a semiconductor memory device, and more particularly, to a burst order control circuit for controlling a burst order in a semiconductor memory device.

2. Description of the Related Art

A semiconductor memory device determines a burst order (i.e., a data output order) in response to a start address SA and an interleave mode signal, and a control circuit for determining the burst order is called a burst order control circuit.

FIG. 1 is a block diagram of a conventional burst order control circuit 110.

Referring to FIG. 1, data transmitted through a plurality of global lines GL<0:3> are outputted through the burst order control circuit 110 to an interface pad DQ.

An operation of the burst order control circuit 110 will be described below with reference to FIG. 1.

Data transmitted in parallel through the global lines GL<0:3> are sorted in series through the burst order control circuit 110 and are outputted through the interface pad DQ. Here, the data are sorted and outputted in the order determined by a start address SA<0:1> and an interleave mode signal INT.

The start address SA<0:1> is used to designate the data to be outputted first. For example, when the data are transmitted through four global lines, the start address may be a 2-bit digital signal. Hereinafter, the value of the start address SA<0:1> is referred to as (SA<1>, SA<0>).

If the value of the start address SA<0:1> is (0, 0), the data of the first global line GL<0> (hereinafter referred to as the first data) is outputted first. If the value of the start address SA<0:1> is (0, 1), the data of the second global line GL<1> (hereinafter referred to as the second data) is outputted first. If the value of the start address SA<0:1> is (1, 0), the data of the third global line GL<2> (hereinafter referred to as the third data) is outputted first. If the value of the start address SA<0:1> is (1, 1), the data of the fourth global line GL<3> (hereinafter referred to as the fourth data) is outputted first.

The interleave mode signal INT is used to control the burst order control circuit 110 to operate in a sequential mode or in an interleave mode. The interleave mode signal INT is activated in the interleave mode and is deactivated in the sequential mode.

When the interleave mode signal INT is deactivated (i.e., the sequential mode), if the data to be outputted first is determined by the start address SA<0:1>, the data are outputted in the following order. For example, if the value of the start address SA<0:1> is (0, 0), the first data is determined to be outputted first and the data are outputted in the order of the first data, the second data, the third data, and the fourth data. If the value of the start address SA<0:1> is (1, 0), the third data is determined to be outputted first and the data are outputted in the order of the third data, the fourth data, the first data, and the second data. The case when the interleave mode signal INT is activated will be described below with reference to FIG. 2.

FIG. 2 is a diagram illustrating the data output order based on the value of the start address SA<0:1> and whether an operation mode is an interleave mode.

Referring to FIG. 2, the first data, the second data, the third data, and the fourth data are denoted by 'D0', 'D1', 'D2', and 'D3' respectively.

In the sequential mode, if the value of the start address SA<0:1> is (0, 0), the data are outputted in the order of 'D0', 'D1', 'D2', and 'D3'. If the value of the start address SA<0:1> is (0, 1), the data are outputted in the order of 'D1', 'D2', 'D3', and 'D0'. If the value of the start address SA<0:1> is (1, 0), the data are outputted in the order of 'D2', 'D3', 'D0', and 'D1'. If the value of the start address SA<0:1> is (1, 1), the data are outputted in the order of 'D3', 'D0', 'D1', and 'D2'.

In the interleave mode, if the value of the start address SA<0:1> is (0, 0), the data are outputted in the order of 'D0', 'D1', 'D2', and 'D3'. If the value of the start address SA<0:1> is (0, 1), the data are outputted in the order of 'D1', 'D0', 'D3', and 'D2'. If the value of the start address SA<0:1> is (1, 0), the data are outputted in the order of 'D2', 'D3', 'D0', and 'D1'. If the value of the start address SA<0:1> is (1, 1), the data are outputted in the order of 'D3', 'D2', 'D1', and 'D0'.

That is, in the process of transmitting the data of the global lines GL<0:3> to the interface pad DQ, the data output order is determined by changing the data transfer path in response to a signal generated using the start address SA<0:1> and the interleave mode signal INV. Here, the data is to be outputted through the interface pad DQ after the time corresponding to a read latency passes from the application of a read command. Thus, a system timing margin and a high-speed operation may be obtained by generating the signal for changing the data transfer path at proper timing.

SUMMARY

Embodiments of the present invention are directed to a burst order control circuit for generating a plurality of transmission signals based on the output time point of data to secure a timing margin for an accurate data output operation and to perform a high-speed operation smoothly.

In accordance with an embodiment of the present invention, a burst order control circuit includes: a signal transmitting unit configured to transmit a second address as first and second signals in response to a mode signal and a first address; a signal delay unit configured to delay a read command, the first signal, and the second signal and generate a delayed read command, a first delayed signal, and a second delayed signal; a signal generating unit configured to generate a burst signal in response to the first address and generate first and second transmission signals in response to the delayed read command and the first and second delayed signals; and an output unit configured to sort and output a plurality of data in response to the burst signal, the first transmission signal, and the second transmission signal.

In accordance with another embodiment of the present invention, a burst order control circuit includes: a plurality of global lines; a signal transmitting unit configured to transmit a second address as first and signals in response to a mode signal and a first address; a signal delay unit configured to delay a read command, the first signal, and the second signal and generate a delayed read command, a first delayed signal, and a second delayed signal; a pipe control unit configured to generate a plurality of input signals and a plurality of output signals in response to the read command; a signal generating unit configured to generate a burst signal in response to the first address and the input signals and generate first and second transmission signals in response to the delayed read command and the first and second delayed signals; and an output unit including a plurality of pipe latch units and configured to sort and output data of the global lines in response to the burst signal, the first transmission signal, and the second transmission signal, wherein the pipe latch units are configured to store the data of the global lines when a corresponding input signal of the input signals is activated and output a stored data when a corresponding output signal of the output signals is activated.

BRIEF DESCRIPTION OF THE DRAWINGS

FIG. 7 is a block diagram of an output unit 340 in accordance with an embodiment of the present invention.

FIG. 12 is a diagram illustrating the configuration and the input/output waveforms of a pipe control unit 940 in accordance with another embodiment of the present invention.

DETAILED DESCRIPTION

Figures 1, 2:
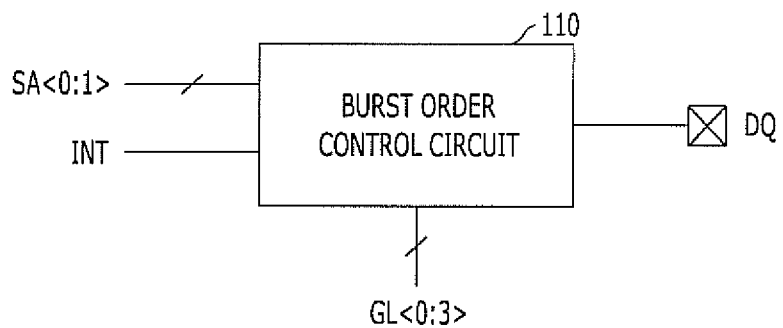
FIG. 1 is a block diagram of a conventional burst order control circuit 110.
FIG. 2 is a diagram illustrating the data output order based on the value of a start address SA<0:1> and whether an operation mode is an interleave mode.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereinafter, a clock delayed through a delay-locked loop (DLL) circuit is referred to as a clock CLK.

Figure 3:
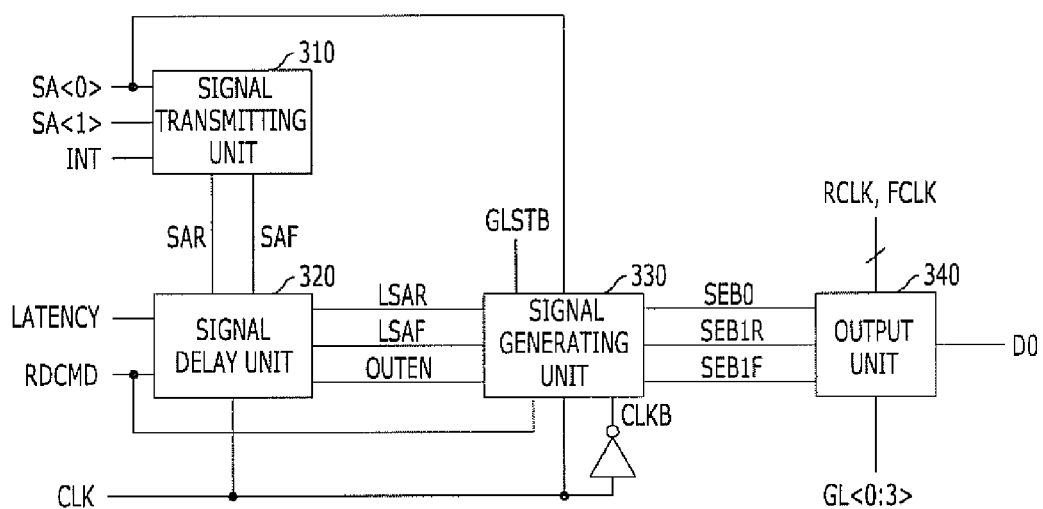
FIG. 3 is a block diagram of a burst order control circuit in accordance with an embodiment of the present invention.

FIG. 3 is a block diagram of a burst order control circuit in accordance with an embodiment of the present invention.

Referring to FIG. 3, a burst order control circuit in accordance with an embodiment of the present invention includes a plurality of global lines GL<0:3>, a signal transmitting unit 310, a signal delay unit 320, a signal generating unit 330, and an output unit 340. According to an example, the number of the global lines GL<0:3> is 4, and data transmitted through the four global lines GL<0:3> are sorted and outputted in response to the value of a start address SA<0:1> and an operation mode (one of a sequential mode and an interleave mode).

An operation of the burst order control circuit will be described below with reference to FIG. 3.

A first address SA<0> and a second address SA<1> are the value of the start address SA<0:1> that is used to select the data to be outputted first among the data of the global lines GL<0:3>. A mode signal INT is used to indicate whether the burst order control circuit is to operate in a sequential mode or in an interleave mode. If the mode signal INT is activated to '1', the burst order control circuit operates in the interleave mode; and if the mode signal INT is deactivated to '0', the burst order control circuit operates in the sequential mode. The data output order according to the value of the start address SA<0:1> and the operation mode is identical to that illustrated in FIG. 2.

The signal transmitting unit 310 transmits the second address SA<1> as a first signal SAR. The signal transmitting unit 310 inverts (or does not invert) the second address SA<1> in response to the mode signal INT and the logic value of the first address SA<0> and transmits the resulting signal as a second signal SAF. The address SA<0:1> may be a 2-clock pulse signal.

Table 301 illustrates the relationship between the second address SA<1>, the second signal SAR, and the second signal SAF according to the mode signal INT and the first address SA<0>. If the mode signal INT is deactivated to '0' and the first address SA<0> is activated to '1', the signal transmitting unit 310 inverts the second address SA<1> and transmits the resulting signal as the second signal SAF. If the mode signal INT and the first address SA<0> are (0, 0), (1, 0), or (1, 1), the signal transmitting unit 310 does not invert the second address SA<1> and transmits the same as the second signal SAF.

The signal delay unit 320 delays a read command RDCMD, the first signal SAR, and the second signal SAF by a delay value to generate a delayed read command OUTEN, a first delayed signal LSAR, and a second delayed signal LSAF. Here, the delay value is determined by latency information LATENCY. The delayed read command OUTEN, the first delayed signal LSAR, and the second delayed signal LSAF are generated at predetermined time points before the data output time point.

For example, the delayed read command OUTEN is generated approximately 2 clocks (CLK) ahead of the data output time point, and the first delayed signal LSAR and the second delayed signal LSAF are generated approximately 1.5 clocks ahead of the data output time point. These signal generation time points are to synchronize accurately with the data output time point. The data output time point is the time point when the time corresponding to a latency passes from the application of the read command RDCMD. The delayed read command OUTEN may be a 1-clock pulse signal. The first delayed signal LSAR and the second delayed signal LSAF may be 2-clock pulse signals. The signal delay unit 320 may include a shifting circuit that operates in synchronization with a clock CLK.

The signal generating unit 330 uses the first address SA<0> to generate a burst signal SEB0, uses the first delayed signal LSAR and the delayed read command OUTEN to generate a first transmission signal SEB1R, and uses the second delayed signal LSAF and the delayed read command OUTEN to generate a second transmission signal SEB1F. Here, the first transmission signal SEB1R and the second transmission signal SEB1F are generated in synchronization with the clock CLK. Therefore, the first transmission signal SEB1R and the second transmission signal SEB1F are generated at the same time point, thus substantially preventing a skew.

The output unit 340 sorts the data of the global lines GL<0:3> in the predetermined order and outputs them to an output node DO in response to the burst signal SEB0, the first transmission signal SEB1R, the second transmission signal SEB1F, an even clock RCLK, and an odd clock FCLK. The output node D0 is connected to an interface pad (not illustrated), and the data are outputted through the interface pad to an external device. The data start to be outputted after the time corresponding to a latency passes from the application of the read command RDCMD. The data output order is determined according to the value of the start address SA<0:1> and the operation mode (the sequential mode or the interleave mode), as described with reference to FIG. 2.

For example, the burst signal SEB0 is generated at the activation time point of a global strobe signal GLSTB, the first transmission signal SEB1R is generated approximately 0.5 clocks ahead of the data output time point, and the second transmission signal SEB1F is generated at the data output time point. This is to synchronize the generation time points of the signals SEB0, SEB1R, and SEB1F, which are used to sort the data, with the data output time point. The global strobe signal GLSTB is used to determine the timing of loading the data into the global lines GL<0:3>.

As described above, according to the present invention, the burst signal SEB0 is generated in synchronization with the time point of transmitting the data through the global lines GL<0:3> to the output unit 340, and the first transmission signal SEB1R and the second transmission signal SEB1F are generated in synchronization with the clock CLK. Accordingly, the burst signal SEB0 is generated accurately in synchronization with the time point of inputting the data of the global lines GL<0:3> into the output unit 340, and the first transmission signal SEB1R and the second transmission signal SEB1F are generated in synchronization with the transmission time point of the data outputted in synchronization with the clock CLK, thus substantially preventing a skew. Accordingly, a margin for preparing a data output operation can be easily secured, and a high-speed operation can be easily implemented.

Figure 4:
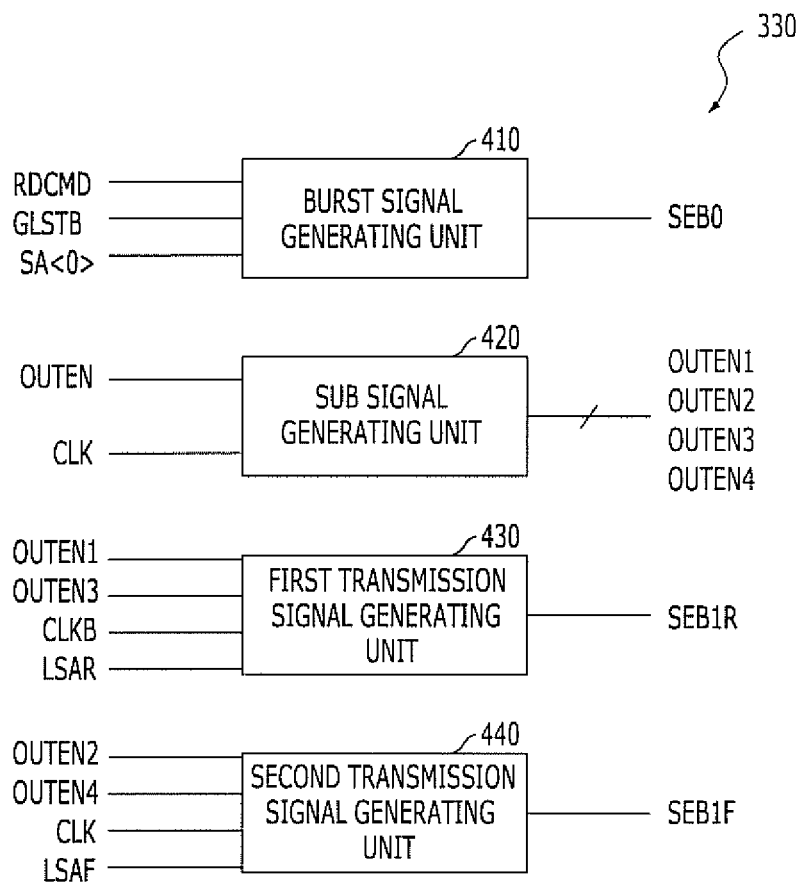
FIG. 4 is a block diagram of a signal generating unit 330 in accordance with an embodiment of the present invention.

FIG. 4 is a block diagram of the signal generating unit 330 in accordance with an embodiment of the present invention.

Referring to FIG. 4, the signal generating unit 330 includes a burst signal generating unit 410, a sub signal generating unit 420, a first transmission signal generating unit 430, and a second transmission signal generating unit 440.

The burst signal generating unit 410 stores the first address SA<0> in response to the read command RDCMD, and inverts the stored first address SA<0> to generate the burst signal SEB0 in response to the activation of the global strobe signal GLSTB.

The sub signal generating unit 420 delays the delayed read command OUTEN by different delay values in synchronization with the clock CLK to generate first to fourth delayed commands OUTEN1 to OUTEN4. The delay values of the first to fourth delayed commands OUTEN1 to OUTEN4 correspond to 1 clock, 1.5 clocks, 2 clocks, and 2.5 clocks (CLK) respectively. These sub signals OUTEN1 to OUTEN4 are used to generate the first and second transmission signals SEB1R and SEB1F.

The first transmission signal generating unit 430 generates the first transmission signal SEB1R, and the second transmission signal generating unit 440 generates the second transmission signal SEB1F. Their operations will be described below in detail with reference to FIG. 6.

Figure 5:
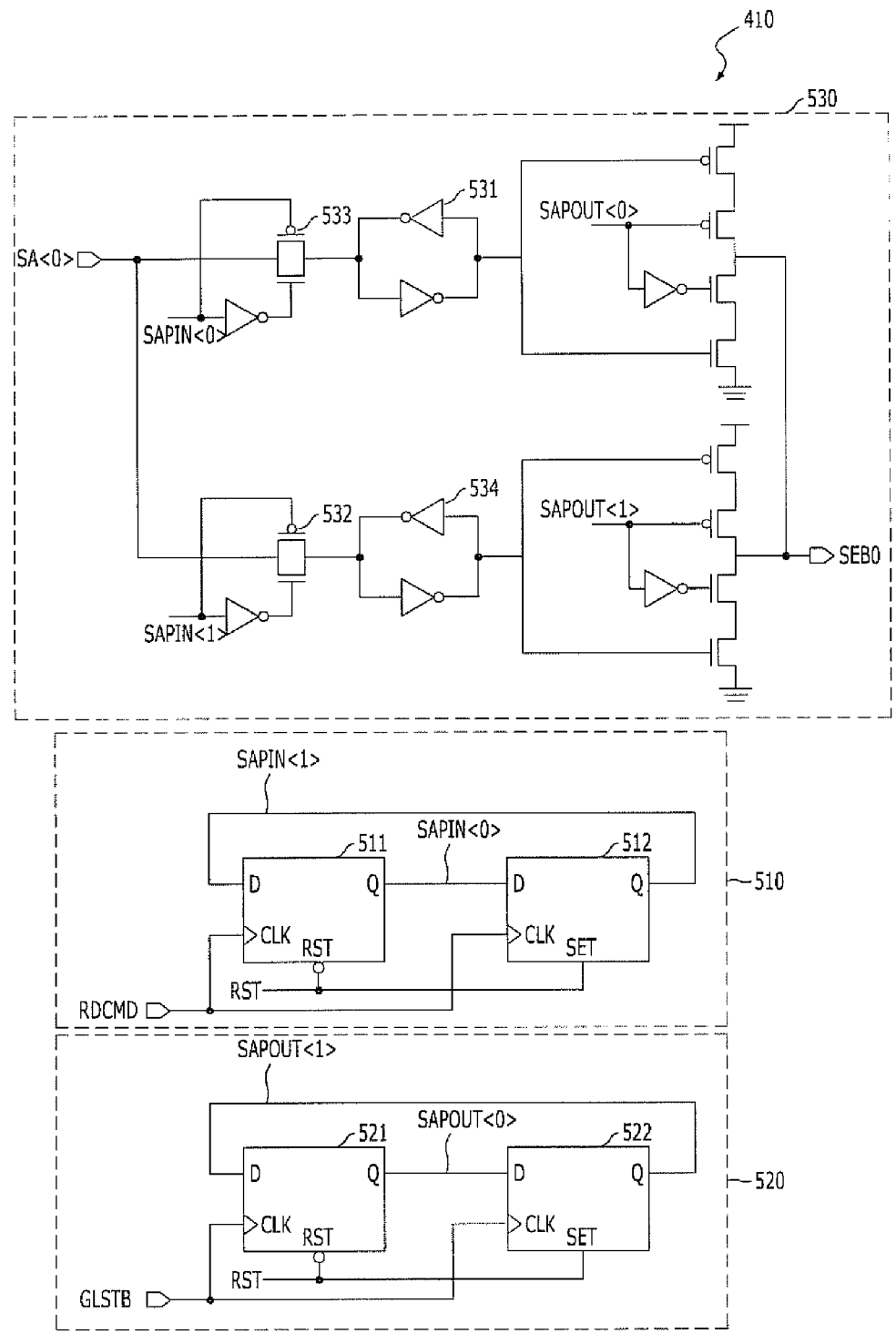
FIG. 5 is a block diagram of a burst signal generating unit 410 in accordance with an embodiment of the present invention.

FIG. 5 is a block diagram of the burst signal generating unit 410 in accordance with an embodiment of the present invention.

Referring to FIG. 5, the burst signal generating unit 410 includes a burst-in signal generating unit 510, a burst-out signal generating unit 520, and a burst generating unit 530.

The burst signal SEB0 is generated by inverting the first address SA<0>. The burst signal SEB0 is one of the signals that are used to sequentially sort the data transmitted through the global lines GL<0:3>. Thus, the burst signal SEB0 is to be generated in synchronization with the time point of transmitting the data through the global lines GL<0:3> to the output unit 340. To this end, the burst signal SEB0 is activated in synchronization with the activation of the global strobe signal GLSTB.

To this end, the burst signal generating unit 410 stores a value of the first address SA<0> when the read command RDCMD is applied thereto, and inverts the value of the stored first address SA<0> to generate the burst signal SEB0 when the global strobe signal GLSTB is applied thereto.

When the read command RDCMD is applied thereto, the burst signal generating unit 410 stores the first address SA<0> in a first latch 531 or a second latch 534 of the burst generating unit 530. Thereafter, when the global strobe signal GLSTB is applied thereto, the burst signal generating unit 410 inverts the value of the stored first address SA<0> to generate the burst signal SEB0.

The reason for using two latches 531 and 534 to store and output the first address SA<0> in an alternate manner is to prevent the value of the stored first address SA<0> from disappearing when the first address SA<0> is again inputted before the output of the value of the stored first address SA<0>, if the data are sequentially inputted through the global lines GL<0:3>.

A burst-in signal (SAPIN<0>, SAPIN<1>) and a burst-out signal (SAPOUT<0>, SAPOUT<1>) are initialized to (0, 1) in response to a reset signal RST. The burst-in signal (SAPIN<0>, SAPIN<1>) is used to select the latch (from the first and second latches 531 and 534) to store the first address SA<0>. The burst-out signal (SAPOUT<0>, SAPOUT<1>) is used to select the latch (from the first and second latches 531 and 534) to transmit the value of the stored first address SA<0> as the burst signal SEB0.

When the read command RDCMD is inputted, the first address SA<0> is stored through a first pass gate 533 into the first latch 531 and the burst-in signal (SAPIN<0>, SAPIN<1>) is changed into (1, 0). When the next read command RDCMD is inputted, the first address SA<0> is stored through a second pass gate 532 into the second latch 534 and the burst-in signal (SAPIN<0>, SAPIN<1>) is changed into (0, 1) like the case of being reset.

Thereafter, when the global strobe signal GLSTB is applied, the value stored in the first latch 531 is inverted and transmitted as the burst signal SEB0 and the burst-out signal (SAPOUT<0>, SAPOUT<1>) is changed into (1, 0). When the next global strobe signal GLSTB is activated, the value stored in the second latch 534 is inverted and transmitted as the burst signal SEB0 and the burst-out signal (SAPOUT<0>, SAPOUT<1>) is changed into (0, 1) like the case of being reset.

The burst-in signal generating unit 510 includes two D flip-flops 511 and 512, and the burst-out signal generating unit 520 includes two D flip-flops 521 and 522.

Figure 6:
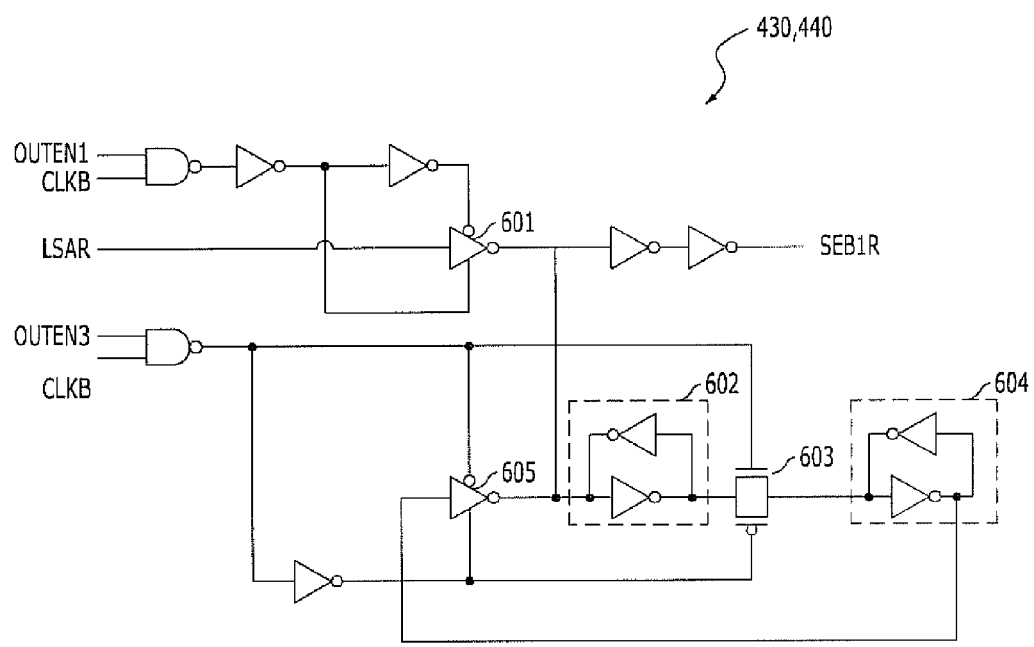
FIG. 6 is a block diagram of a transmission signal generating unit 430/440 in accordance with an embodiment of the present invention.

FIG. 6 is a block diagram of the transmission signal generating unit 430/440 in accordance with an embodiment of the present invention.

The first transmission signal generating unit 430 and the second transmission signal generating unit 440 are substantially identical to each other with the exception that they have different input signals. Thus, the following description focuses on an operation of the first transmission signal generating unit 430.

Referring to FIG. 6, the first transmission signal generating unit 430 includes a first inverter 601, a first latch 602, a pass gate 603, a second latch 604, and a second inverter 605.

In the period when the first delayed command OUTEN1 and an inverted clock CLKB (opposite to the clock CLK in phase) are simultaneously activated to '1', the value of the first delayed signal LSAR is inverted by the first inverter 601, stored in the first latch 602, and transmitted as the first transmission signal SEB1R. Generally, the first delayed command OUTEN1 is activated first. Therefore, when the inverted clock CLKB is changed (activated) from '0' to '1' in the activated period of the first delayed command OUTEN1, the first transmission signal SEB1R has an opposite value to the value of the first delayed signal LSAR. When at least one of the first delayed command OUTEN1 and the inverted clock CLKB is deactivated, the first inverter 601 is closed and the value of the first transmission signal SEB1R is retained.

The stored value is retained, and the pass gate 603 and the second inverter 605 are opened in the period when the third delayed command OUTEN3 and the inverted clock CLKB are simultaneously activated. Accordingly, the value stored in the first latch 602 is stored into the second latch 604 through the pass gate 603, and the value stored in the second latch 604 is transmitted through the second inverter 605 as the first transmission signal SEB1R. Accordingly, the value of the first transmission signal SEB1R in the period when the third delayed command OUTEN3 and the inverted clock CLKB are simultaneously activated is an inversion of the value in the period when the first delayed command OUTEN1 and the inverted clock CLKB are simultaneously activated. When at least one of the first delayed command OUTEN1 and the inverted clock CLKB is deactivated, the pass gate 603 and the second inverter 605 are closed and the value of the first transmission signal SEB1R is retained.

In this manner, the first transmission signal SEB1R is generated by the first transmission signal generating unit 430.

The above operation is to generate the first transmission signal SEB1R in synchronization with the clock CLK in response to the first delayed signal LSAR. The first transmission signal SEB1R is a 1-clock pulse signal and is activated 0.5 clocks ahead of the data output time point. Provided that the first transmission signal SEB1R can be generated using the first delayed signal LSAR that is activated 1.5 clocks ahead of the data output time point and has a pulse width of 2 clocks, the first transmission signal generating unit 430 of FIG. 6 may have different configurations.

Consequently, whether the first transmission signal SEB1R is to change from '1' to '0' or from '0' to '1' is determined according to the value of the first delayed signal LSAR in the period when the first delayed command OUTEN1 and the inverted clock CLKB are simultaneously activated.

The second transmission signal generating unit 440 operates in the same manner as described above, by using the second delayed signal LSAF instead of the first delayed signal LSAR, the second delayed command OUTEN2 instead of the first delayed command OUTEN1, the fourth delayed command OUTEN4 instead of the third delayed command OUTEN3, and the clock CLK instead of the inverted clock CLKB. Accordingly, the second transmission signal SEB1F is generated at a node corresponding to a node where the first transmission signal SEB1R is generated by the first transmission signal generating unit 430.

FIG. 7 is a block diagram of the output unit 340 in accordance with an embodiment of the present invention.

Referring to FIG. 7, the output unit 340 includes a preliminary transmission unit 710, an even transmission unit 720, an odd transmission unit 730, and an output transmission unit 740.

The preliminary transmission unit 710 transmits the data of the global lines GL<0:3> to a plurality of preliminary lines PRE<0:3> according to a correspondence relationship determined by the burst signal SEB0. In the drawings, a signal '/SIGNAL NAME' is a signal opposite to a signal 'SIGNAL NAME' in phase.

When the burst signal SEB0 is '1', the preliminary transmission unit 710 transmits the data of the first global line GL<0> to the first even preliminary line PRE<0>, transmits the data of the second global line GL<1> to the first odd preliminary line PRE<1>, transmits the data of the third global line GL<2> to the second even preliminary line PRE<2>, and transmits the data of the fourth global line GL<3> to the second odd preliminary line PRE<3>.

When the burst signal SEB0 is '0', the preliminary transmission unit 710 transmits the data of the first global line GL<0> to the first odd preliminary line PRE<1>, transmits the data of the second global line GL<1> to the first even preliminary line PRE<0>, transmits the data of the third global line GL<2> to the second odd preliminary line PRE<3>, transmits the data of the fourth global line GL<3> to the second even preliminary line PRE<2>.

That is, when the burst signal SEB0 changes from '1' to '0', the correspondence relationships of the even preliminary line PRE<0>/PRE<2> and the odd preliminary line PRE<1>/PRE<3> with the global lines GL<0:3> are interchanged.

The even transmission unit 720 transmits the data of the first even preliminary line PRE<0> to an even line RDO in the activated period of the first transmission signal SEB1R and transmits the data of the second even preliminary line PRE<2> to the even line RDO in the deactivated period of the first transmission signal SEB1R.

The odd transmission unit 740 transmits the data of the first odd preliminary line PRE<1> to an odd line FDO in the activated period of the second transmission signal SEB1F and transmits the data of the second odd preliminary line PRE<3> to the odd line FDO in the deactivated period of the second transmission signal SEB1F.

Accordingly, when the first transmission signal SEB1R changes from '1' to '0', the data of the first even preliminary line PRE<0> is transmitted to the even fine RDO and then the data of the second even preliminary line PRE<2> is transmitted to the even line RDO. When the first transmission signal SEB1R changes from '0' to '1', the data of the second even preliminary line PRE<2> is transmitted to the even line RDO and then the data of the first even preliminary line PRE<0> is transmitted to the even line RDO. The order of the data transmitted to the odd line FDO is similar to the order of the data transmitted to the even line RDO.

The output transmission unit 740 transmits the data of the even line RDO to the output line DO in the activated period of the even clock RCLK and transmits the data of the odd line FDO to the output line DO in the activated period of the odd clock FCLK.

Here, the even clock RCLK is generated in the data output period by using the activation of the clock CLK, and the odd clock FCLK is generated in the data output period by using the activation of the inverted clock CLKB. For example, a signal obtained by combining the first delayed command OUTEN1 and the third delayed command OUTEN3 by an OR gate is combined with the clock CLK by an AND gate to generate the even clock RCLK, and a signal obtained by combining the second delayed command OUTEN2 and the fourth delayed command OUTEN4 by an OR gate is combined with the inverted clock CLKB by an AND gate to generate the odd clock FCLK.

The burst order control circuit controls the output unit 340 to sort the data of the global lines GL<0:3> in the order determined by the value of the start address SA<0:1> and the operation mode and output them to the output line DO in series. To this end, the burst signal SEB0, the first transmission signal SEB1R, and the second transmission signal SEB1F are generated according to the operation mode in response to the value of the start address SA<0:1>.

The burst signal SEB0 is generated in synchronization with the application time point of the global strobe signal SLSTB, and the first transmission signal SEB1R and the second transmission signal SEB1F are generated in synchronization with the clock CLK. The length of the data corresponds to a clock period, and a 1-clock period becomes shorter with an increase in the operation frequency. Therefore, when burst signal SEB0, the first transmission signal SEB1R, and the second transmission signal SEB1F reaches the output unit 340 in synchronization with the data output time point and the time point when the data of the global lines GL<0:3> reaches the output unit 340, the timing margin for the data output operation can be secured and the high-speed operation can be easily implemented.

Figure 8A:
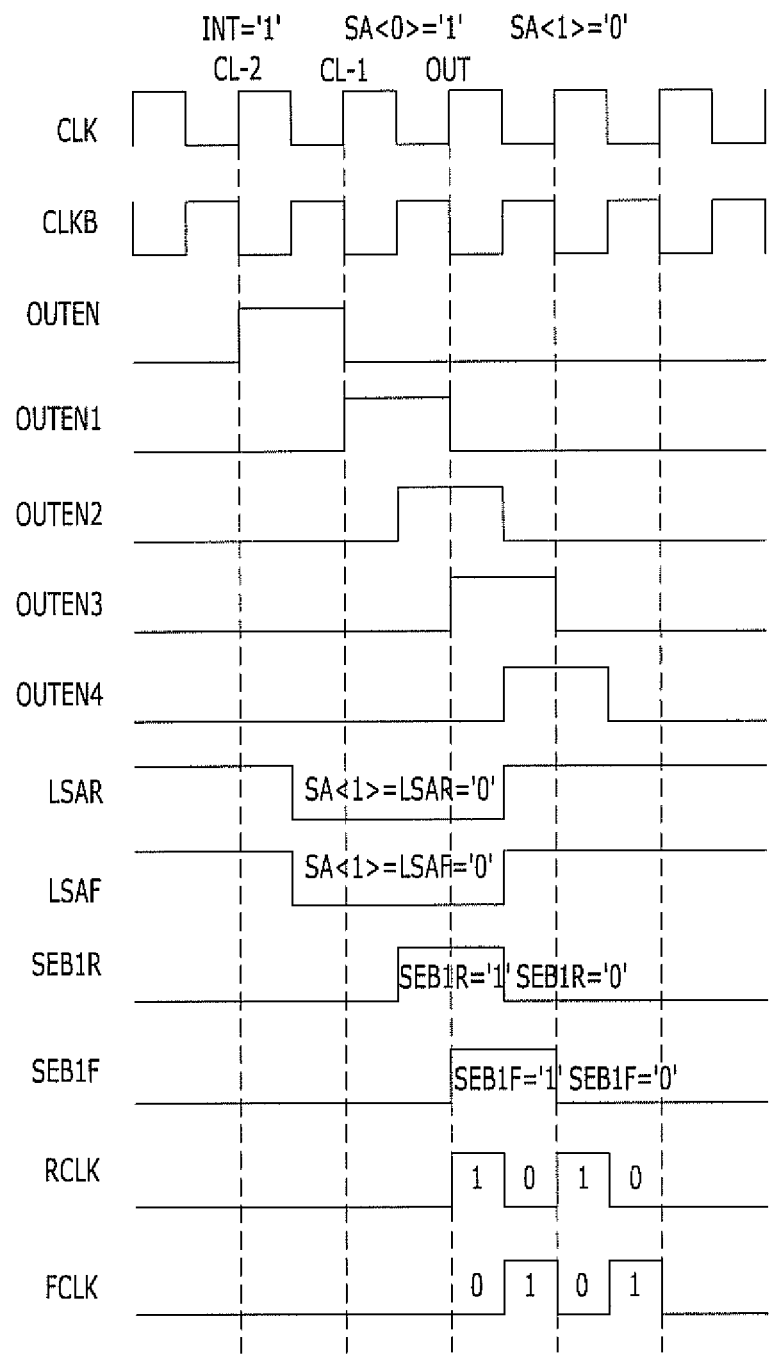
FIG. 8A is a waveform diagram illustrating an operation of a burst order control circuit in accordance with an embodiment of the present invention.

FIG. 8A is a waveform diagram illustrating an operation of a burst order control circuit in accordance with an embodiment of the present invention.

FIG. 8A illustrates an operation in the case where the start address SA<0:1> is (0, 1) in the interleave mode (INT='1'). That is, (SA<1>, SA<0>)=(0, 1).

Referring to FIG. 8A, a clock CLK is an output clock of a DLL circuit, and an inverted clock CLKB is an opposite clock to the clock CLK in phase.

The delayed read command OUTEN is activated 2 clocks ahead of the data output time point. 'OUT' denotes the data output time point when the data start to be outputted. 'CL-2' denotes the time point preceding the data output time point by 2 clocks. 'CL-1' denotes the time point preceding the data output time point by 1 clock.

The first to fourth delayed commands OUTEN1 to OUTEN4 are generated by delaying the delayed read command OUTEN by 1 clock, 1.5 clocks, 2 clocks, and 2.5 clocks respectively.

As described with reference to FIG. 3, if INT='1' and SA<0>='1', the first signal SAR and the second signal SAF are equal to the second address SA<1>. Thus, the first delayed signal LSAR and the second delayed signal LSAF have the same value as the second address SA<1> while having different activation time points. In FIG. 8A, because the second address SA<1> is '0', the first delayed signal LSAR and the second delayed signal LSAF are also '0'.

The first transmission signal SEB1R is activated to have the opposite value '1' to the value of the first delayed signal LSAR at the time point when the first delayed command OUTEN1 and the inverted clock CLKB are simultaneously activated. It changes from the activated value to the opposite value '0' at the time point when the third delayed command OUTEN3 and the inverted clock CLKB are simultaneously activated.

The second transmission signal SEB1F is activated to have the opposite value '1' to the value of the second delayed signal LSAF at the time point when the second delayed command OUTEN2 and the clock CLK are simultaneously activated. It changes from the activated value to the opposite value '0' at the time point when the fourth delayed command OUTEN4 and the clock CLK are simultaneously activated.

The even clock RCLK and the odd clock FCLK have the opposite phases to each other and are activated in a data output period. The data output period is a period corresponding to 2 clocks from the data output time point OUT.

Figure 8B:
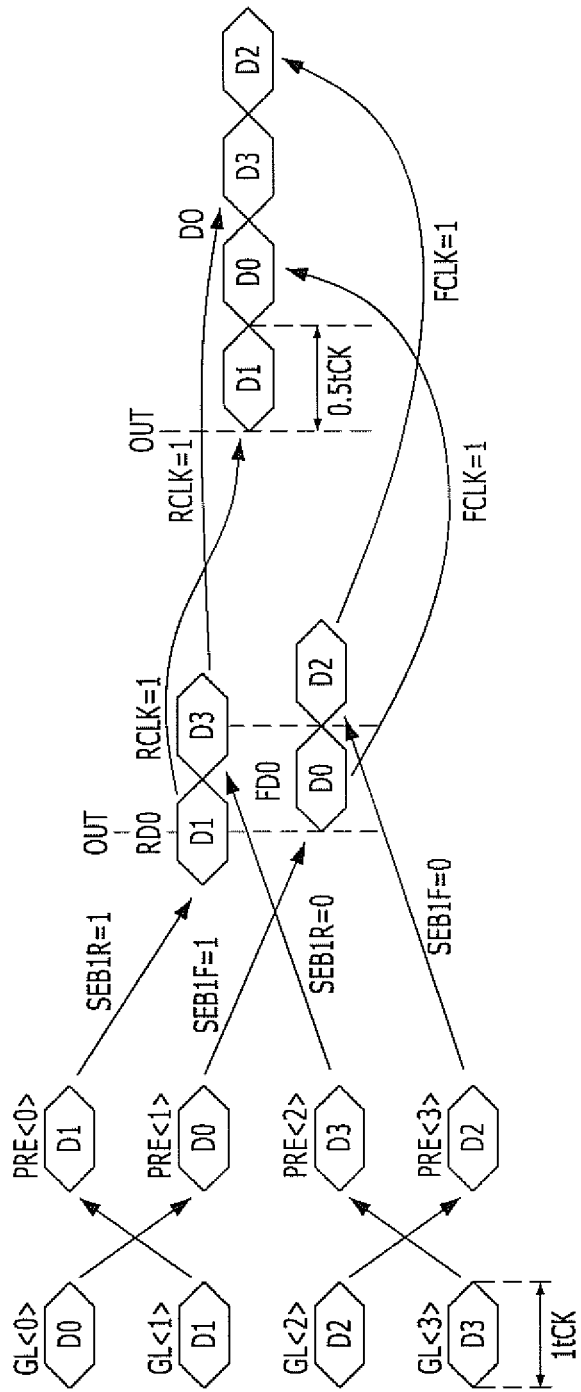
FIG. 8B is a diagram illustrating a process of sorting data of a plurality of global lines GL<0:3> when the burst order control circuit operates according to the waveform diagram of FIG. 8A.

FIG. 8B is a diagram illustrating a process of sorting data of the global lines GL<0:3> when the burst order control circuit operates according to the waveform diagram of FIG. 8A.

Like FIG. 8A, FIG. 8B illustrates an operation in the case where the start address SA<0:1> is (0, 1) in the interleave mode (INT='1'). The numeral on each of the data D1 to D4 denotes a global line into which the data is loaded. For example, 'D0' denotes a first data D0 loaded into a first global line GL<0>.

First, when the first address SA<0> is '1', the burst signal SEB0 is '0'. Accordingly, the data D0 of the first global line GL<0> is transmitted to the first odd preliminary line PRE<1>. The data D1 of the second global line GL<1> is transmitted to the first even preliminary line PRE<0>. The data D2 of the third global line GL<2> is transmitted to the second odd preliminary line PRE<3>. The data D3 of the fourth global line GL<3> is transmitted to the second even preliminary line PRE<2>.

Secondly, when the first transmission signal SEB1R is '1', the data D1 of the first even preliminary line PRE<0> is transmitted to the even line RDO. When the second transmission signal SEB1F is '1', the data D0 of the first odd preliminary line PRE<1> is transmitted to the odd line FDO. When the first transmission signal SEB1R is '0', the data D3 of the second even preliminary line PRE<2> is transmitted to the even line RDO. When the second transmission signal SEB1F is '0', the data D0 of the second odd preliminary line PRE<3> is transmitted to the odd line FDO. The above order corresponds to the data transmission order.

Lastly, when the even clock RCLK and the odd clock FCLK are activated to '1' in an alternate manner, the data D1 and D3 of the even line RDO and the data D0 and D2 of the odd line FDO are transmitted to the output line DO in an alternate manner. Accordingly, the data are outputted from the output line DO in the order of 'D1', 'D0', 'D3', and 'D2'.

Figure 9:
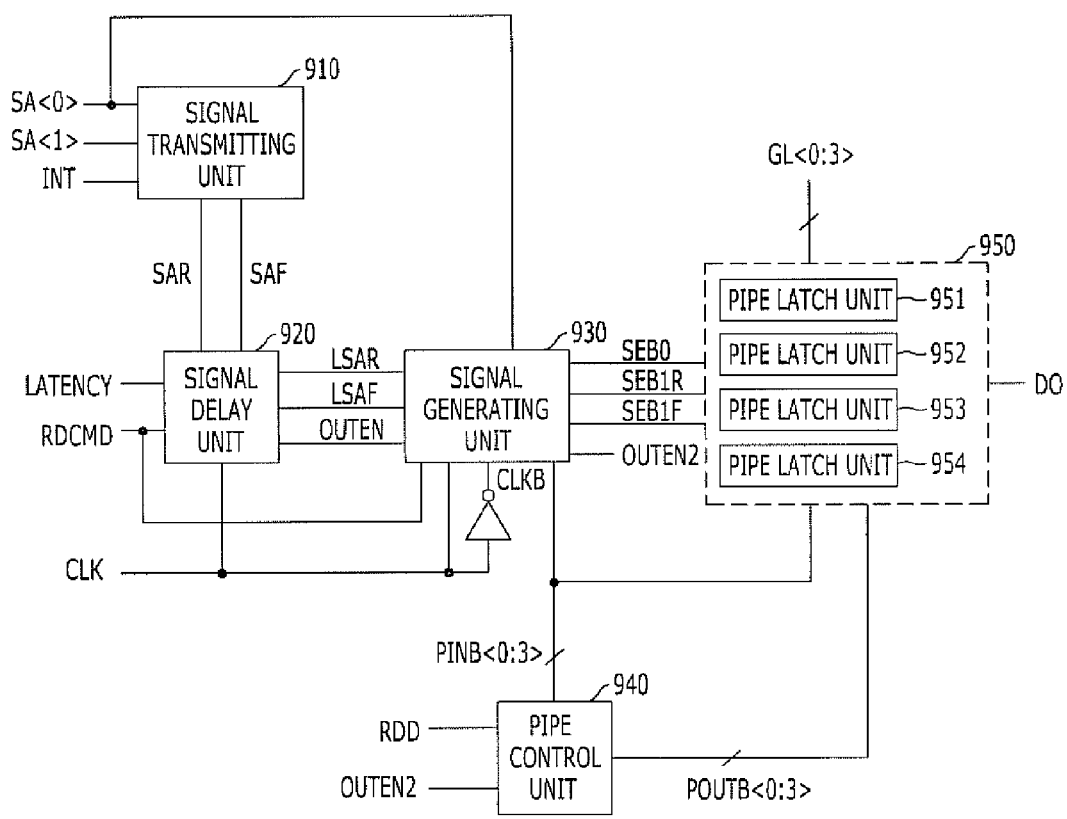
FIG. 9 is a block diagram of a burst order control circuit in accordance with another embodiment of the present invention.

FIG. 9 is a block diagram of a burst order control circuit in accordance with another embodiment of the present invention.

If data are sequentially inputted through a plurality of global lines GL<0:3>, the burst order control circuit of FIG. 9 sorts and outputs the data in the order that the data is input. If the data are transmitted at short intervals, a data collision may occur when the data are transmitted before the output of the previously-transmitted data. The burst order control circuit of FIG. 9 may store the data in pipe latches 951 to 954 in the order of data transmission and may output the data in the order of data transmission.

Referring to FIG. 9, the burst order control circuit includes a plurality of global lines GL<0:3>, a signal transmitting unit 910, a signal delay unit 920, a signal generating unit 930, a pipe control unit 940, and an output unit 950.

An operation of the burst order control circuit will be described below with reference to FIG. 9.

The configurations and operations of the signal transmitting unit 910 and the signal delay unit 920 are identical to the configurations and operations of the signal transmitting unit 310 and the signal delay unit 320 illustrated in FIG. 3.

The configuration and operation of the signal generating unit 930 are substantially identical to the configuration and operation of the signal generating unit 330 illustrated in FIG. 3. However, the signal generating unit 930 is different from the signal generating unit 330 in generating the burst signal SEB0 at the time point when one of a plurality of input signals PINB<0:3> is activated. The reason for this is that the burst order control circuit of FIG. 9 inputs the data of the global lines GL<0:3> into the output unit 950 at the time point when one of the input signals PINB<0:3> is activated. The configurations and operations for generating the first transmission signal SEB1R and the second transmission signal SEB1F are identical to those described with reference to FIG. 3.

The pipe control unit 940 generates a plurality of input signals PINB<0:3> and a plurality of output signals POUTB<0:3> to control a plurality of pipe latch units 951 to 954 included in the output unit 950. When the input signals PINB<0>, PINB<1>, PINB<2>, and PINB<3> are activated, the respective pipe latch units 951, 952, 953, and 954 receive and store the data of the global lines GL<0>, GL<1>, GL<2>, and GL<3>. Thereafter, when the output signals POUTB<0>, POUT<1>, POUT<2>, and POUT<3> are activated, the respective pipe latch units 951, 952, 953, 954 transmit the stored data to a plurality of preliminary lines PRE<0:3>.

A read signal RDD generated by delaying a read command RDCMD by an address access time tAA is divided and the resulting signals are inverted to generate a plurality of input signals PINB<0:3>. Also, the pipe control unit 940 divides a second delayed command OUTEN2 and inverts the resulting signals to generate a plurality of output signals POUTB<0:3>. Here, the address access time tAA may correspond to the time taken to transmit the data from a memory cell to the output unit 950.

The output unit 950 sorts and outputs the data of the global lines GL<0:3> in the predetermined order in response to the burst signal SEB0, the first transmission signal SEB1R, the second transmission signal SEB1F, an even clock RCLK, and an odd clock FCLK. The output unit 950 includes a plurality of pipe latch units 951 to 954. When data are sequentially transmitted to the global lines GL<0:3>, the output unit 950 sequentially stores the data in the pipe latch units 951 to 954. When the output signals POUTB<0:3> are sequentially activated, the output unit 950 sorts and outputs the data that are sequentially outputted from the pipe latch units 951 to 954.

For example, if data are transmitted two times to the global lines GL<0:3>, four data are simultaneously inputted at a time since the number of the global lines GL<0:3> is 4. The first input data is stored in the first pipe latch unit 951 in response to the activated first input signal PINB<0>, and the second input data is stored in the second pipe latch unit 952 in response to the activated second input signal PINB<1>.

The four data stored in the first pipe latch unit 951 are outputted in response to the activated first output signal POUTB<0>. Thereafter, the four data stored in the second pipe latch unit 952 are outputted in response to the activated second output signal POUTB<1>. Here, the output order of the four data outputted in response to each output signal is determined by the first address SA<0> and the operation mode.

The configuration and operation of the output unit 950 are substantially identical to the configuration and operation of the output unit 340 of FIG. 7 with the exception that the preliminary transmission unit 710 is replaced by the pipe latch units 951 to 954. The pipe latch units 951 to 954 will be described below in detail with reference to FIG. 13.

Figure 10:
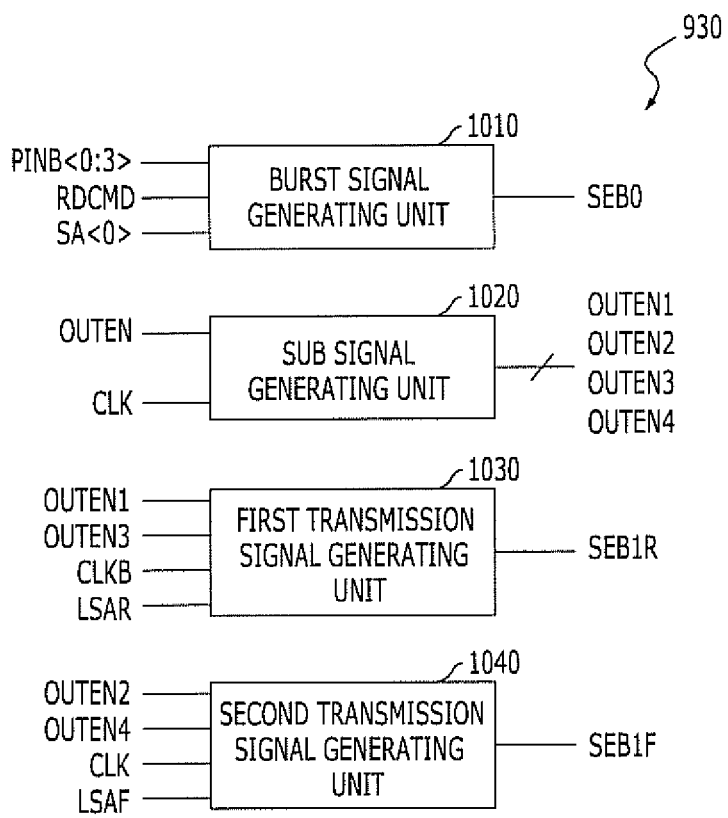
FIG. 10 is a block diagram of a signal generating unit 930 in accordance with another embodiment of the present invention.

FIG. 10 is a block diagram of the signal generating unit 930 in accordance with another embodiment of the present invention.

Referring to FIG. 10, the signal generating unit 930 includes a burst signal generating unit 1010, a sub signal generating unit 1020, a first transmission signal generating unit 1030, and a second transmission signal generating unit 1040.

The burst signal generating unit 1010 stores the first address SA<0> in response to the read command RDCMD, and inverts the stored first address SA<0> to generate the burst signal SEB0 in response to the activation of one of the input signals PINB<0:3>.

The configurations and operations of the sub signal generating unit 1020, the first transmission signal generating unit 1030, and the second transmission signal generating unit 1040 are identical to those described with reference to FIGS. 4 and 6.

Figure 11:
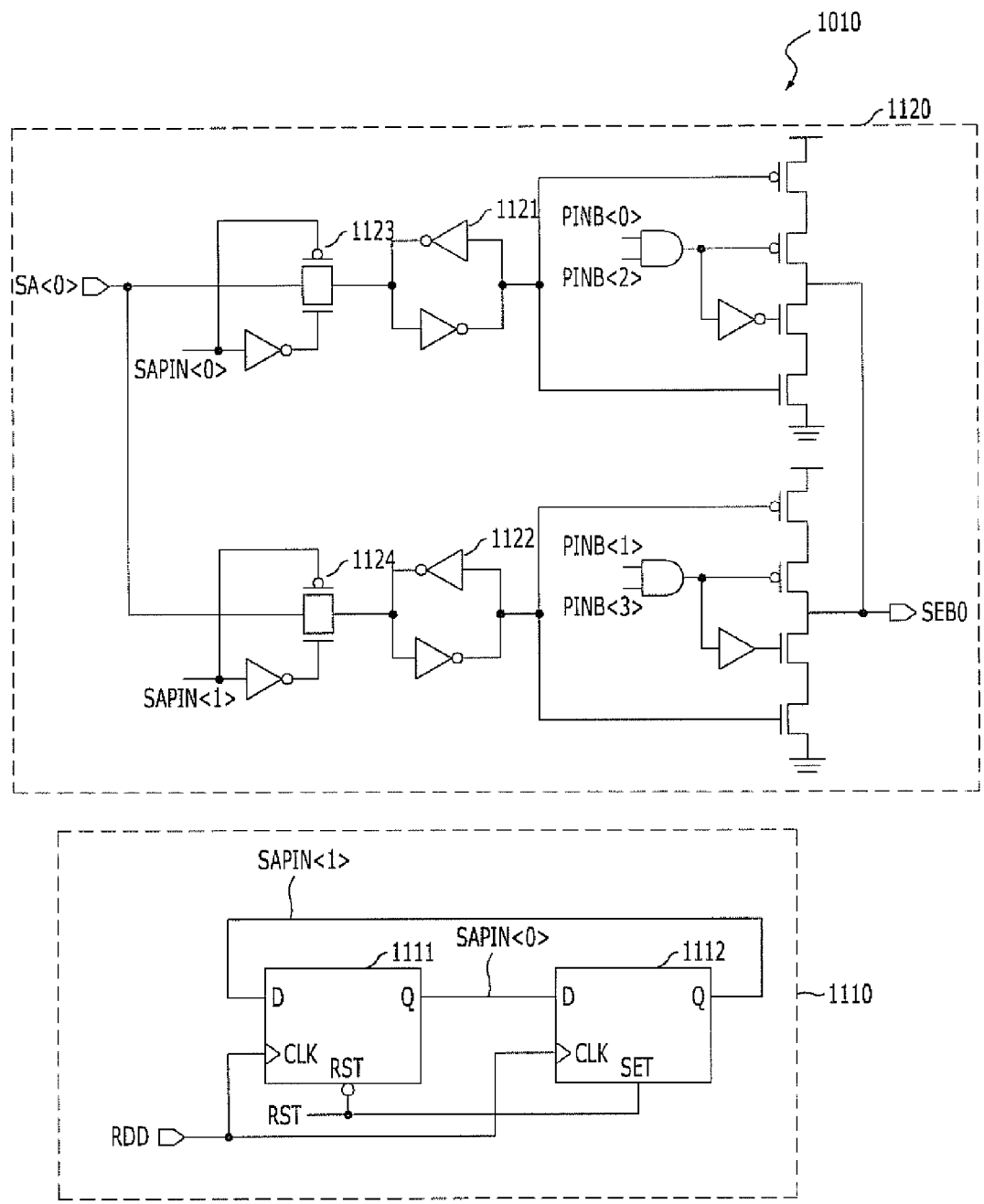
FIG. 11 is a block diagram of a burst signal generating unit 1010 in accordance with another embodiment of the present invention.

FIG. 11 is a block diagram of the burst signal generating unit 1010 in accordance with another embodiment of the present invention.

Referring to FIG. 11, the burst signal generating unit 1010 includes a burst-in signal generating unit 1110 and a burst generating unit 1120. The configuration and operation of the bust signal generating unit 1010 are substantially identical to those described with reference to FIG. 5, and thus the following description focuses on the difference. The configuration and operation of the bust-in signal generating unit 1110 are identical to those of the burst-in signal generating unit 510 illustrated in FIG. 5.

The burst-in signal generating unit 1110 includes two D flip-flops 1111 and 1112 to generate a burst-in signal SAPIN<0:1>. The burst generating unit 1120 includes two pass gate 1123 and 1124 and two latches 1121 and 1122.

The burst signal SEB0 is generated by inverting the first address SA<0>. For the same reason as described with reference to FIG. 5, the burst signal SEB0 is to be generated in synchronization with the time point of transmitting the data through the global lines GL<0:3> to the output unit 950. The burst order control circuit of FIG. 9 transmits data to the output unit 950 when one of the input signals PINB<0:3> is activated. Thus, the burst signal SEB0 is activated in synchronization with the activation of one of the input signals PINB<0:3>.

To this end, the burst signal generating unit 1010 stores the value of the first address SA<0> when the read command RDCMD is applied thereto, and inverts the stored value to generate the burst signal SEB0 when one of the input signals PINB<0:3> is activated.

When the read command RDCMD is applied thereto, the burst signal generating unit 1010 stores the first address SA<0> in the first latch 1121 or the second latch 1122. Thereafter, in response to the input signals PINB<0:3>, the burst signal generating unit 1010 inverts the stored value to generate the burst signal SEB0.

The reason for using two latches 531 and 534 to store and output the first address SA<0> in an alternate manner is the same as described with reference to FIG. 5. In FIG. 11, when odd-numbered input signals PINB<0> and PINB<2> are activated, the first address SA<0> is stored in the first latch 1121 prior to transmission. When even-numbered input signals PINB<1> and PINB<3> are activated, the first address SA<0> is stored in the second latch 1122 prior to transmission.

FIG. 12 is a diagram illustrating the configuration and the input/output waveforms of the pipe control unit 940 in accordance with another embodiment of the present invention.

Referring to FIG. 12, the pipe control unit 940 is configured to include a general ring counter. The frequency of an input signal is divided by 4, and the period of an output signal becomes four times of the period of the input signal.

The pipe control unit 940 includes a first division unit 1210 and a second division unit 1220. The first division unit 1210 divides (¼-division in FIG. 12) the frequency of a delayed read signal RDD to generate a plurality of input signals PINB<0:3>. The second division unit 1220 divides (¼-division in FIG. 12) the frequency of the second delayed command OUTEN2 to generate a plurality of output signals POUT<0:3>.

The first division unit 1210 and the second division unit 1220 are identical in terms of configurations and operations. The first division unit 1210 includes a plurality of shift units 1211 to 1214.

The outputs OUT1 to OUT4 of the shift units 1211 to 1214 correspond to the input signals PINB<0:3>. When a reset signal RST of the shift units 1211 to 1214 is activated, the outputs (OUT1, OUT2, OUT3, OUT4) is initialized to an initial output value (1, 0, 0, 0). The value '1' is shifted at a rising edge of a signal inputted into a 'CK' terminal.

A waveform diagram 1201 illustrates the relationship between the input IN and the outputs OUT1 to OUT4 of the division units 1210 and 1220. When the input IN is the delayed read signal RDD, the inversion signals of the outputs OUT1 to OUT4 are the input signals PINB<0:3>. When the input IN is the second delayed command OUTEN2, the inversion signals of the outputs OUT1 to OUT4 are the output signals POUTB<0:3>. '/PINB<K>' denotes an inversion signal of the $K^{th}$ input signal PINB<K>, and '/POUTB<K>' denotes an inversion signal of the $K^{th}$ output signal POUTB<K>. The input signals PINB<0:3> and the output signals POUTB<0:3> illustrated in FIG. 11 have an opposite phase to the signals of '/PINB<0:3>' and '/POUT<0:3>' represented in the waveform diagram 1201 illustrated in FIG. 12.

The reason for using the second delayed command OUTEN2 to generate the output signals POUTB<0:3> is to transmit the first transmission signal SEB1R and the second transmission signal SEB1F to the output unit 950 in synchronization with the time point of outputting data from the pipe latch units 951 to 954.

Figure 13:
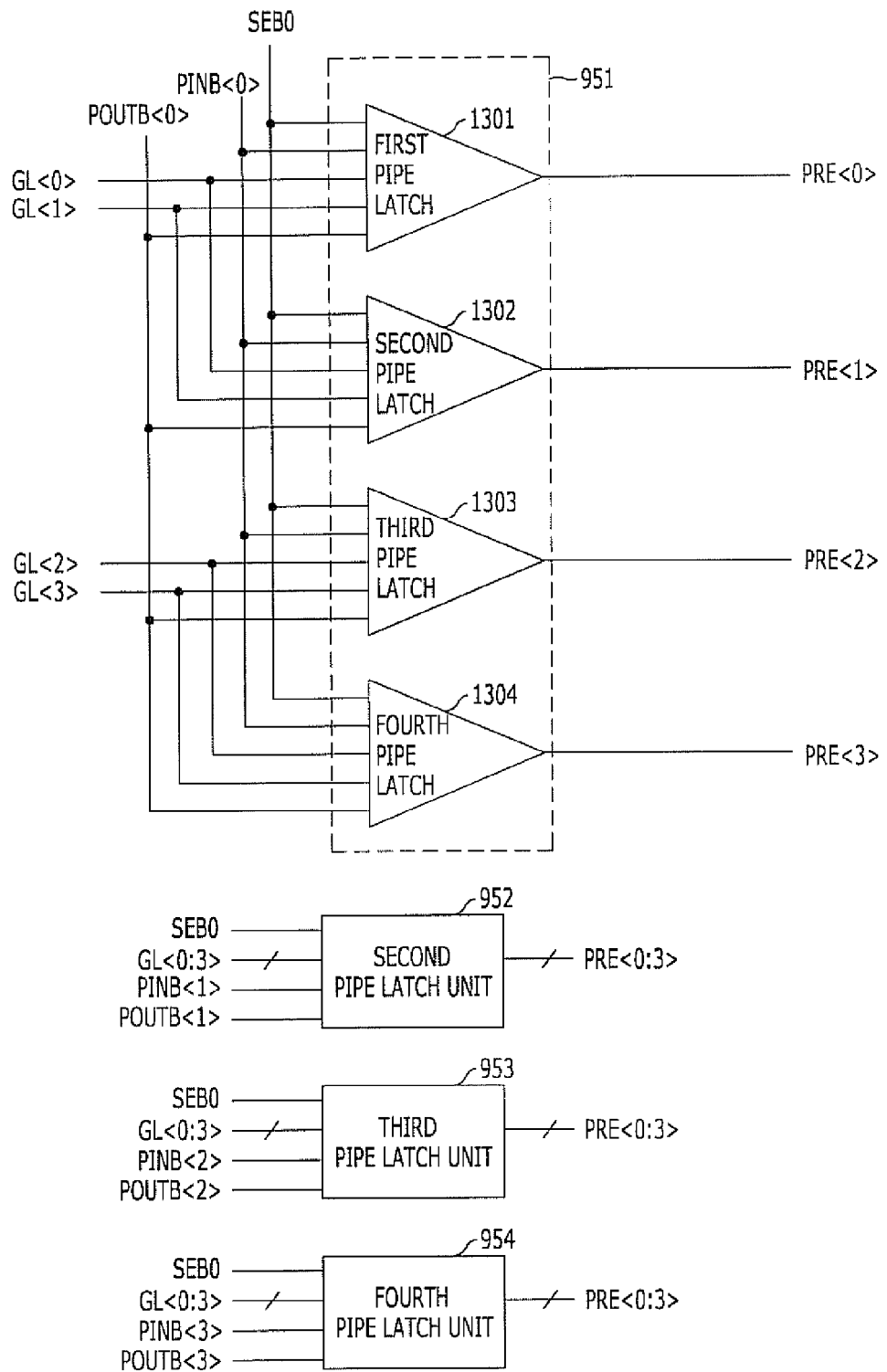
FIG. 13 is a block diagram of a plurality of pipe latch units 951 to 954 in accordance with another embodiment of the present invention.

FIG. 13 is a block diagram of the pipe latch units 951 to 954 in accordance with another embodiment of the present invention.

Referring to FIG. 13, each of the pipe latch units 951 to 954 includes a plurality of pipe latches 1301 to 1304. The first to fourth pipe latch units 951 to 954 are identical in terms of configurations and operations, and thus the following description focuses on the configuration and operation of the first pipe latch unit 951.

A plurality of pipe latches 1301 to 1304 included in the first pipe latch unit 951 correspond to a plurality of preliminary lines PRE<0:3>, respectively. The first to fourth pipe latches 1301 to 1304 correspond respectively to the first even preliminary line PRE<0>, the first odd preliminary line PRE<1>, the second even preliminary line PRE<2>, and the second odd preliminary line PRE<3>, respectively.

When the first input signal PINB<0> is activated, the pipe latches 1301 to 1304 receive the data of the global lines GL<0:3>. Here, the correspondence relationship between the pipe latches 1301 to 1304 and the global lines GL<0:3> is determined by the burst signal SEB0.

The first and second pipe latches 1301 and 1302 receive and store the data of the first global line GL<0> or the data of the second global line GL<1>. When the burst signal SEB0 is high, the data of the first global line GL<0> is stored in the first pipe latch 1301 and the data of the second global line GL<1> is stored in the second pipe latch 1302. When the burst signal SEB0 is low, the data of the first global line GL<0> is stored in the second pipe latch 1302 and the data of the second global line GL<1> is stored in the first pipe latch 1301.

The relationship between the third and fourth pipe latches 1303 and 1304 and the third and fourth global lines GL<2> and GL<3> is the same as described above.

When the first output signal POUT<0:3> is activated, the data stored in the pipe latches 1301 to 1304 are transmitted to the corresponding preliminary lines PRE<0:3>.

Thereafter, the data are outputted through the same process as the burst order control circuit of FIG. 3. When data are sequentially inputted into the global lines GL<0:3>, the burst order control circuit of FIG. 9 outputs the data in a FIFO (First In First Out) manner and the data sorting order is the same as described with reference to FIG. 3. Also, because all signals are activated accurately in synchronization with the clock CLK, the burst order control circuit of FIG. 9 is advantageous in performing a high-speed operation like the burst order control circuit of FIG. 3.

As described above, the burst order control circuit of the present invention generates the transmission signals more accurately at the set time points before the data output time point, thus securing a timing margin for preparing a data output operation.

While the present invention has been described with respect to the specific embodiments, it will be apparent to those skilled in the art that various changes and modifications may be made without departing from the spirit and scope of the invention as defined in the following claims.

What is claimed is:

1. A burst order control circuit comprising:
    a signal transmitting unit configured to transmit a second address as first and second signals in response to a mode signal and a first address;
    a signal delay unit configured to delay a read command, the first signal, and the second signal and generate a delayed read command, a first delayed signal, and a second delayed signal;
    a signal generating unit configured to generate a burst signal in response to the first address and generate first and second transmission signals in response to the delayed read command and the first and second delayed signals; and
    an output unit configured to sort and output a plurality of data in response to the burst signal, the first transmission signal, and the second transmission signal.

2. The burst order control circuit of claim 1, wherein the mode signal has a logic value varying depending on whether an operation mode is a sequential mode or an interleave mode.

3. The burst order control circuit of claim 2, wherein the output unit is configured to receive the plurality of data in an activated period of a global strobe signal.

4. The burst order control circuit of claim 3, wherein the signal transmitting unit is configured to:
  transmit the second address as the first signal;
  invert the second address to transmit an inverted signal as the second signal when the mode signal is deactivated and the first address is activated; and
  transmit the second address as the second signal when the mode signal is activated and the first address is activated or when the first address is deactivated.

5. The burst order control circuit of claim 4, wherein the signal delay unit is configured to delay the read command, the first signal, and the second signal in response to latency information to generate the delayed read command, the first delayed signal, and the second delayed signal that are activated at a set time point before the plurality of data are outputted from the output unit.

6. The burst order control circuit of claim 5, wherein the signal generating unit comprises:
  a burst signal generating unit configured to store the first address in response to an activation of the read command and invert a stored first address to generate the burst signal in response to an activation of the global strobe signal;
  a sub signal generating unit configured to delay the delayed read command by different delay values to generate first to fourth delayed commands;
  a first transmission signal generating unit configured to generate the first transmission signal by using the first delayed command, the third delayed command, and the first delayed signal; and
  a second transmission signal generating unit configured to generate the second transmission signal by using the second delayed command, the third delayed command, and the second delayed signal.

7. The burst order control circuit of claim 6, wherein the sub signal generating unit, the first transmission signal generating unit, and the second transmission signal generating unit operate in synchronization with a clock signal.

8. The burst order control circuit of claim 7, wherein
  the first transmission signal generating unit is configured to invert the first delayed signal, store an inverted signal and transmit a stored signal as the first transmission signal in a period when the first delayed command and an inverted clock signal of the clock signal are simultaneously activated and is configured to invert the stored signal and transmit an inverted signal as the first transmission signal in a period when the third delayed command and the inverted clock signal are simultaneously activated; and
  the second transmission signal generating unit is configured to invert the second delayed signal, store an inverted signal and transmit a stored signal as the second transmission signal in a period when the second delayed command and the clock signal are simultaneously activated and is configured to invert the stored signal and transmit an inverted signal as the second transmission signal in a period when the fourth delayed command and the clock signal are simultaneously activated.

9. The burst order control circuit of claim 8, wherein the output unit comprises:
  a preliminary transmission unit configured to transmit the plurality of data to a plurality of preliminary lines in response to the burst signal;
  an even transmission unit configured to transmit data of even preliminary line among the preliminary lines to an even line in response to the first transmission signal;
  an odd transmission unit configured to transmit data of odd preliminary line among the preliminary lines to an odd line in response to the second transmission signal; and
  an output transmission unit configured to transmit data of the even line to an output line in response to an even clock and transmit data of the odd line to the output line in response to an odd clock.

10. The burst order control circuit of claim 9, wherein
  the even clock is generated in response to the clock signal in a period when the first delayed command or the third delayed command is activated; and
  the odd clock is generated in response to the inverted clock signal in a period when the second delayed command or the third delayed command is activated.

11. The burst order control circuit of claim 10, wherein
  the even preliminary line includes a first even preliminary line and a second even preliminary line, and the odd preliminary line includes a first odd preliminary line and a second odd preliminary line,
  wherein the even transmission unit is configured to transmit data of the first even preliminary line to the even line in an activated period of the first transmission signal and transmit data of the second even preliminary line to the even line in a deactivated period of the first transmission signal; and
  the odd transmission unit is configured to transmit data of the first odd preliminary line to the odd line in an activated period of the second transmission signal and transmit data of the second odd preliminary line to the odd line in a deactivated period of the second transmission signal.

12. The burst order control circuit of claim 1, further comprising a plurality of global lines,
  wherein the plurality of data are transmitted from the plurality of global lines to the output unit.

13. A burst order control circuit comprising:
  a plurality of global lines;
  a signal transmitting unit configured to transmit a second address as first and second signals in response to a mode signal and a first address;
  a signal delay unit configured to delay a read command, the first signal, and the second signal and generate a delayed read command, a first delayed signal, and a second delayed signal;
  a pipe control unit configured to generate a plurality of input signals and a plurality of output signals in response to the read command;
  a signal generating unit configured to generate a burst signal in response to the first address and the input signals and generate first and second transmission signals in response to the delayed read command and the first and second delayed signals; and
  an output unit including a plurality of pipe latch units and configured to sort and output data of the global lines in response to the burst signal, the first transmission signal, and the second transmission signal, wherein the pipe latch units are configured to store the data of the global lines when a corresponding input signal of the input signals is activated and output stored data when a corresponding output signal of the output signals is activated.

14. The burst order control circuit of claim 13, wherein the signal transmitting unit is configured to:
  transmit the second address as the first signal;
  invert the second address to transmit an inverted signal as the second signal when the mode signal is deactivated and the first address is activated; and transmit the second address as the second signal when the mode signal is activated and the first address is activated or when the first address is deactivated.

15. The burst order control circuit of claim 14, wherein the signal generating unit comprises:
   a burst signal generating unit configured to store the first address in response to an activation of the read command and invert a stored first address to generate the burst signal when one of the input signals is activated;
   a sub signal generating unit configured to delay the delayed read command by different delay values to generate first to fourth delayed commands;
   a first transmission signal generating unit configured to generate the first transmission signal by using the first delayed command, the third delayed command, and the first delayed signal; and
   a second transmission signal generating unit configured to generate the second transmission signal by using the second delayed command, the third delayed command, and the second delayed signal.

16. The burst order control circuit of claim 15, wherein the sub signal generating unit, the first transmission signal generating unit, and the second transmission signal generating unit operate in synchronization with a clock signal.

17. The burst order control circuit of claim 16, wherein the pipe control unit is configured to generate the input signals in response to a signal obtained by delaying the read command by a set delay value and generate the output signals in response to the second delayed command.

18. The burst order control circuit of claim 17, wherein
   the pipe latch units correspond to a plurality of preliminary lines, respectively, and each includes a plurality of pipe latches; and
   the pipe latches are configured to store data of a global line determined by the burst signal among the global lines and transmit stored data to a corresponding line of the preliminary lines when a corresponding output signal of the output signals is activated.

19. The burst order control circuit of claim 18, wherein the output unit further includes:
   an even transmission unit configured to transmit data of even preliminary line among the preliminary lines to an even line in response to the first transmission signal;
   an odd transmission unit configured to transmit data of odd preliminary line among the preliminary lines to an odd line in response to the second transmission signal; and
   an output transmission unit configured to transmit data of the even line to an output line in response to an even clock and transmit data of the odd line to the output line in response to an odd clock.

20. The burst order control circuit of claim 17, wherein the pip control unit includes a division unit configured to divide frequencies of the second delayed command and the signal obtained by delaying the read command to generate the input signals and the output signals, respectively.

\* \* \* \* \*